(12) United States Patent
Takahashi et al.

(10) Patent No.: US 9,299,760 B2
(45) Date of Patent: Mar. 29, 2016

(54) ORGANIC EL DISPLAY DEVICE

(71) Applicant: Japan Display Inc., Tokyo (JP)

(72) Inventors: Kouhei Takahashi, Tokyo (JP);
Toshihiro Sato, Tokyo (JP); Naohisa Ando, Tokyo (JP); Hiroshi Kawanago, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 14/291,103

(22) Filed: May 30, 2014

(65) Prior Publication Data

US 2014/0353641 A1 Dec. 4, 2014

(30) Foreign Application Priority Data

May 31, 2013 (JP) ................. 2013-115093

(51) Int. Cl.
*H01L 27/32* (2006.01)
*H05K 1/18* (2006.01)
*H05K 3/32* (2006.01)

(52) U.S. Cl.
CPC ............ *H01L 27/3276* (2013.01); *H05K 1/189* (2013.01); *H05K 3/323* (2013.01); *H01L 2227/323* (2013.01); *H05K 2201/10128* (2013.01)

(58) Field of Classification Search
CPC ... H01L 27/32–27/326; H01L 51/50–51/5287; H01L 2227/32–2227/326; H01L 2251/5323–2251/5361; H01L 2924/12044
USPC .................. 257/79–103, 40, 59, 72, E51.001, 257/E51.01; 438/99
See application file for complete search history.

(56) References Cited

U.S. PATENT DOCUMENTS

| 5,700,715 A * | 12/1997 | Pasch ................ H01L 23/53285 228/180.22 |
| 5,953,094 A * | 9/1999 | Matsuoka ............. G02F 1/1339 349/153 |
| 7,180,181 B2 * | 2/2007 | Liu .................... H01L 23/49894 257/724 |
| 7,645,512 B1 * | 1/2010 | Sammakia ............... H01B 1/22 156/275.7 |
| 7,843,545 B2 * | 11/2010 | Jung ..................... G02F 1/1345 349/139 |
| 2008/0165315 A1 * | 7/2008 | Nishida .................. G02B 1/118 349/137 |

FOREIGN PATENT DOCUMENTS

JP 2007-73355 A 3/2007

* cited by examiner

*Primary Examiner* — Steven Loke
*Assistant Examiner* — Samuel Park
(74) *Attorney, Agent, or Firm* — Typha IP LLC (57) ABSTRACT

A circuit unit is provided in which it is possible to connect circuit board to a terminal using a simple operation without removing a passivation film from above the terminal. A metal electrode which conducts with a circuit element is formed above a substrate. Multiple column shaped insulation films are each formed at a uniform pitch in two intersecting directions above the surface of the metal electrode. A metal electrode is formed above the metal electrode including the insulation film. A passivation film is formed on a surface of the metal electrode. Conductive beads are stuck between pairs of projection structured bodies formed on a surface of the passivation film, the passivation film on a side surface of the projection structure is scraped whereby the conductive beads conduct simultaneously with the metal electrode and an electrode formed on the circuit board.

10 Claims, 10 Drawing Sheets

ORGANIC EL DISPLAY DEVICE

CROSS REFERENCE TO RELATED APPLICATIONS

This application is based upon and claims the benefit of priority from the prior Japanese Patent Application No. 2013-115093, filed on May 31, 2013, the entire contents of which are incorporated herein by reference.

FIELD

The present invention is related to an organic EL (electroluminescence) display device included on the surface of a terminal which can be electrically connected to other electronic parts such as a circuit board.

BACKGROUND

Wiring for outputting a signal which supplies a power supply to a circuit element of electronic device is formed above a circuit board a conducts with the circuit element formed or installed above the circuit board or electronic devices connected to the circuit board. In addition, an end part of each wire is formed as a terminal for connecting to another circuit board (including a flexible printed circuit board). An organic layer is formed on an upper layer of a circuit layer in a display area of an organic EL display device. The organic layer/film easily deteriorates due to a water component or oxygen. The organic layer is covered by a passivation film in order to prevent deterioration of the organic layer. Because CVD (Chemical Vapor Deposition) is generally adopted as a process for forming this passivation layer since it is necessary to form a film thinly and uniformly, the passivation layer is formed above the organic layer and at the same time above a terminal where the organic layer is not present.

Figure 9:
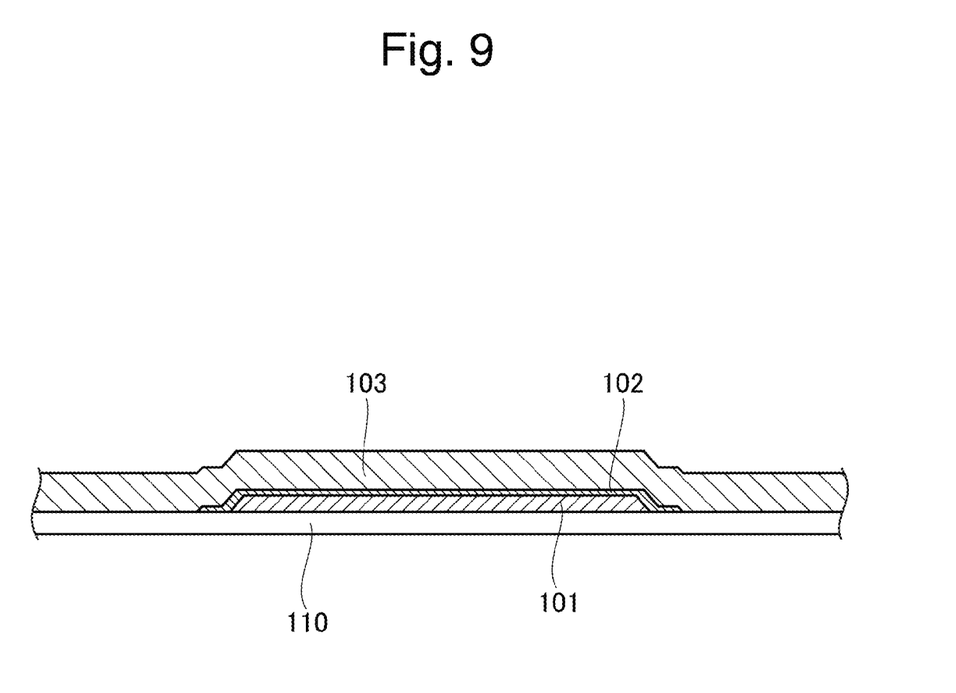
FIG. 9 is a cross sectional diagram showing a layer structure of a terminal part.

The vertical cross sectional diagram in FIG. 9 shows an example structure of a terminal formed on an end part of a substrate 110 comprising an organic EL display device. That is, in this example, a flat film shaped first metal electrode 101 which conducts with a driver circuit (not shown in the diagram) for driving each light emitting element (not shown in the diagram) forming the organic EL display device is formed from a metal such as aluminum above the surface of the substrate 110, a second metal electrode 102 is formed from ITO (Indium Tin Oxide) to cover the first metal electrode 101, and a passivation film 103 comprised from silicon nitride is formed on an upper surface of the second metal electrode 102 and upper surface of the substrate 110.

Since the passivation film has insulation properties, after forming the passivation film, if the passivation film (passivation film 103) is not removed once from above the terminal (second metal electrode 102), the terminal (second metal electrode 102) can not be connected to another circuit board.

Conventionally, dry etching is used when removing a passivation film (passivation film 103) from above a terminal (second metal electrode 102). A manufacturing method of an organic EL element in which a passivation layer is patterned is disclosed in Japanese Laid Open Patent 2007-073355.

However, a long process time is required for removing a passivation film forming by CVD using dry etching.

Therefore, one aim of the present invention is to provide an organic EL display device in which a terminal can be connected to another circuit board using an easy process without removing a passivation film from the terminal.

SUMMARY

An organic EL display device according to the present invention includes a display area arranged with an OLED element above a substrate, the device including a terminal which can be conductive with an electrode of circuit board in an exterior side region of the display area, the terminal is arranged with an electrode formed above the substrate, an insulation film formed intermittently in a certain direction at the surface of the electrode and overlapping the surface of the electrode, a metal film formed so as to cover an upper surface of the electrode and a surface of the insulation film, and a passivation film formed on the surface of the metal film, wherein the electrode, insulation film and metal film are included in the terminal.

An electrode and organic film are formed in the organic EL display device according to the present invention, including all components by in which the surface of which is covered by a passivation film. Therefore, electronic circuit components may be installed or not installed above a substrate.

DESCRIPTION OF EMBODIMENTS

Embodiments of an organic EL display device according to the present invention are explained below while referring to the drawings.

Figure 1:
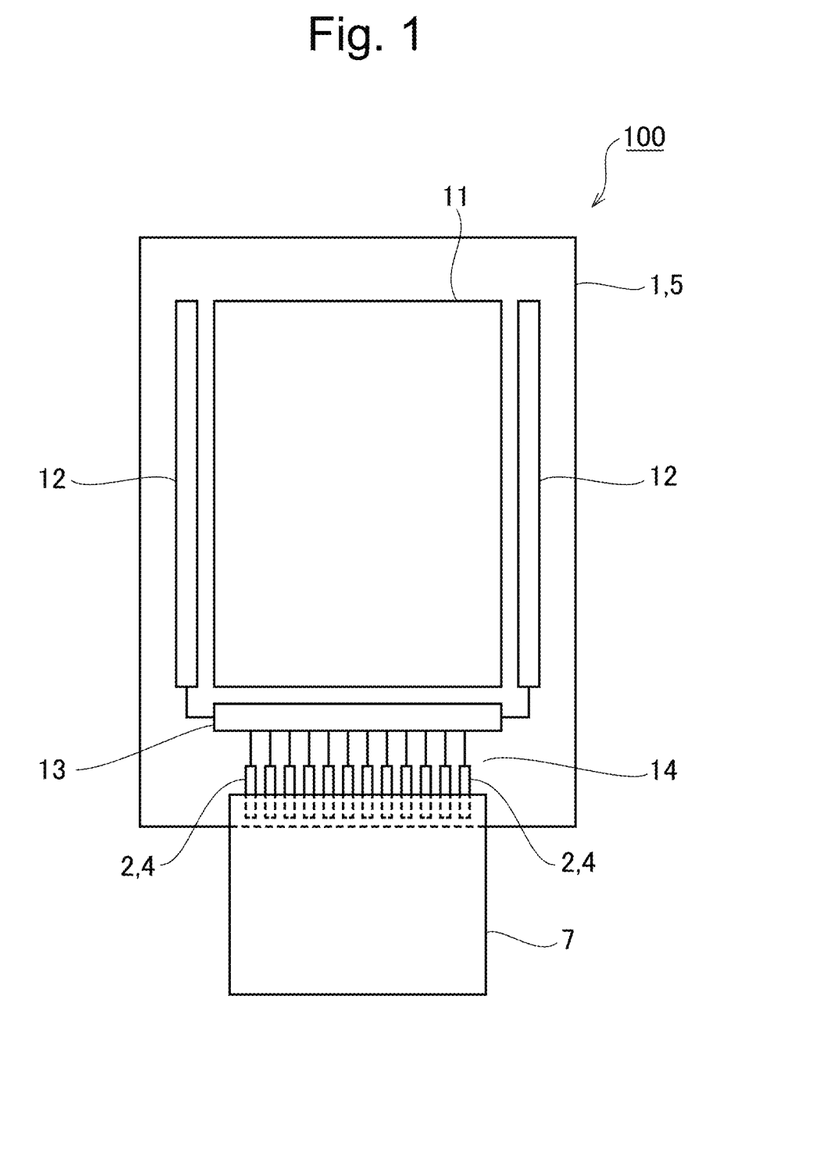
FIG. 1 is a planar diagram of an organic EL display device according to a first embodiment.
Figure 2:
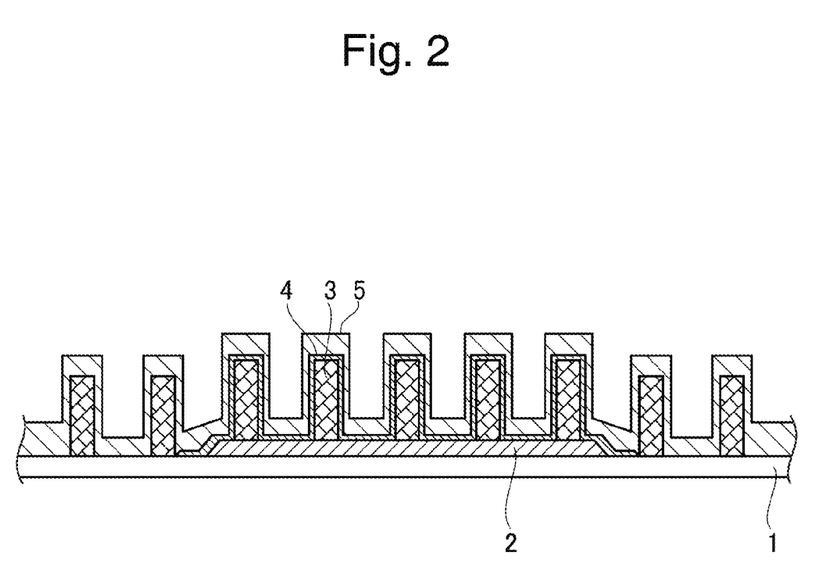
FIG. 2 is a partial exploded vertical cross sectional diagram of a terminal part of the organic EL display device according to a first embodiment.
Figure 3:
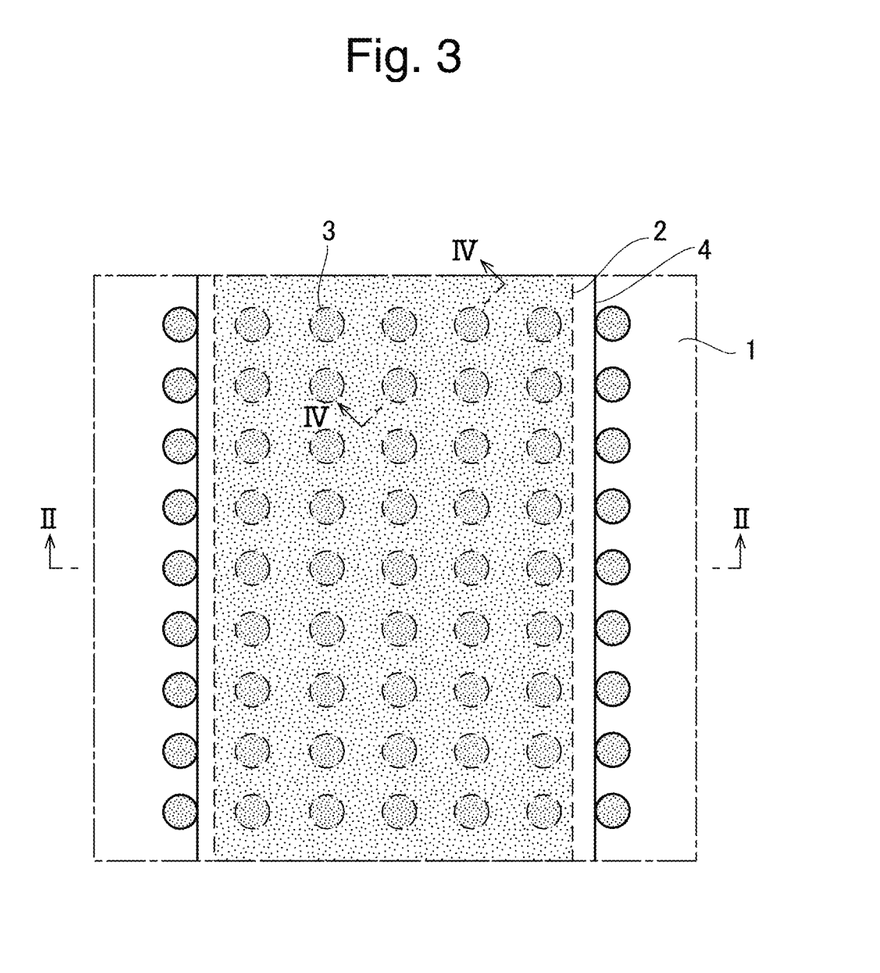
FIG. 3 is a partial exploded planar diagram of a terminal part of the organic EL display device according to a first embodiment.

FIG. 1 is a planar diagram of an organic EL display device 100. FIG. 2 is a vertical cross sectional (cross section along the line II-II in FIG. 3 which is parallel with an edge of a substrate 1 and intersects the length direction of wiring) showing a substrate connection structure formed on an end part of a substrate 1 which forms the organic EL display device, and also shows an exploded view of the vicinity of one terminal formed on an end part of the substrate 1. In addition, FIG. 3 is a planar diagram showing an exploded view of a vicinity of one terminal formed on an end part of the substrate 1 which forms the organic EL display device.

As is shown in FIG. 1, seen from a planar view, multiple OLED (Organic Light-Emitting Diode) elements are arranged along a matrix shape at the center of the organic EL display device 100, and a display area 11 in which in an image is displayed is formed when the OLED elements are selectively driven. In addition, drive circuits (X driver, Y driver, shift resistor etc.) 12, 13 for selectively driving each OLED element within the display area 11 are arranged at three locations of a periphery region (referred to herein as "frame region") of the display area 11 on an upper surface of the organic EL display device 100.

The display area 11 and each drive circuit 12, 13 are formed above one substrate 1. In addition, multiple wiring patterns for connecting to ground as well as supplying a power source voltage and drive signal to each drive circuit are formed to conduct with each drive circuit 12, 13 in the vicinity of an edge near the drive circuit 13 on the substrate 1. An end of each wire is linked individually linked with a length direction facing strip shaped metal electrode 2 in a direction intersecting an edge near the substrate 1. In addition, each metal electrode is aligned in a band shape along the edge described above on the substrate 1 to form a terminal 14 connected to a flexible printed circuit board 7 for supplying external drive power, drive signals and an earth potential.

Furthermore, in the case where the circuit board connection structure of the present embodiment is applied to a liquid crystal display panel or MEMS display panel, a liquid crystal display element or MEMS shutter is formed in the display area 11.

The surface of the organic EL display device 100 including the parts where the display area 11 and each drive circuit 12, 13 are formed is covered by a passivation film 14 comprised from an insulation material.

As is shown in FIG. 2 and FIG. 3, a metal electrode 2 which is formed by a metal such as aluminum above the surface of the substrate 1 and which conducts with a circuit (not shown in the diagram) for driving each light emitting element (not shown in the diagram) which form the display area 11 is formed as a metal thin film. A plurality of pillar shaped (column shape for example) insulation films 3 comprised from polyimide or acryl is each formed by a photolithography process at a certain pitch in a parallel direction and an intersecting direction to the length direction of the metal electrode 2 on above the surface of the metal electrode 2 and above the upper surface of the substrate 1 in the periphery of the metal electrode 2. In the examples shown in FIG. 2 and FIG. 3, nine standing insulation films 3 are formed in a parallel direction to the length direction of the metal electrode 2, seven insulation films 3 are formed in a direction intersecting the length direction of the metal electrode 2, and five inner side insulation films 3 among the seven insulation films 3 formed in this direction are formed above the surface of the metal electrode 2.

In addition, a metal electrode 4 is formed using ITO sputtering so as to cover the metal electrode 2 and the entire exterior surface of 9×5 insulation films 3 formed above the metal electrode 2. In this way, since the metal electrode 4 is formed using sputtering, the metal electrode 4 is also formed on the side surface of each insulation film 3.

Figure 4:
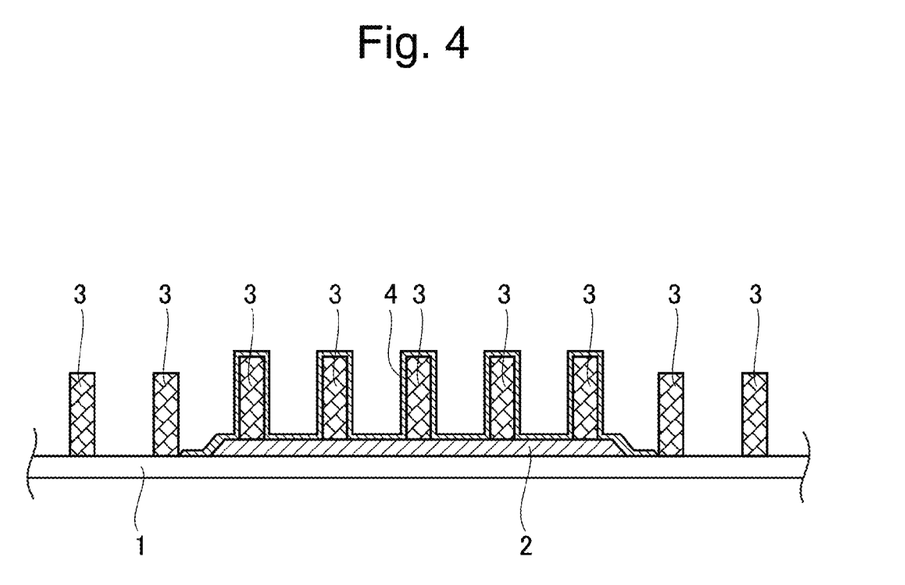
FIG. 4 is a partial exploded vertical cross sectional diagram showing a manufacturing process of the organic EL display device according to a first embodiment.

The formation of the metal electrode 2, the formation of the insulation film 3 and the formation of the metal electrode 4 above the substrate 1 described above are formed in the order as described. In addition, a vertical cross sectional view at the point where the formation of the metal electrode 4 is complete is shown in FIG. 4.

Next, a passivation film 5 comprised from silicon oxide is formed using CVD to across the entire upper surface of the substrate 1 including the surface of the metal electrode 4 and the surface of the insulation film 3 not covered by the metal electrode 4. In this way, since the passivation film 5 is formed using CVD, the film thickness of the passivation film 5 on the side surface of the insulation film 3 becomes thinner than the film thickness of the passivation film 5 on the upper surface of the insulation film 3. In addition, the surface of the passivation film 5 has an asperity shape which projects following the shape of the insulation film 3 at the location where a terminal (metal electrode 2, 4) is formed and in that vicinity. Furthermore, the projection of the passivation film 5 is referred to as "projection structured body" below.

Figure 5:
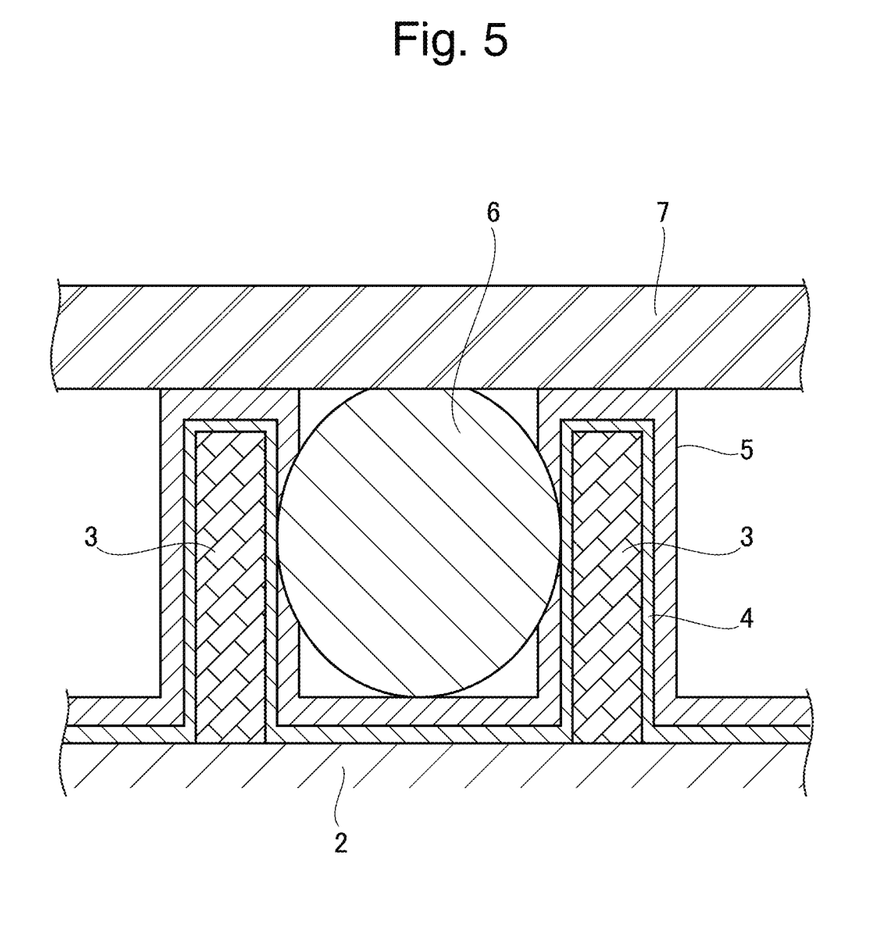
FIG. 5 is a partial exploded vertical cross sectional diagram showing the effects of a terminal part of the organic EL display device according to a first embodiment.

In order to conduct the metal electrode 2 with other wires above the circuit board 7 using the connection structure formed as described above, a plurality of conductive beads 6 comprised from metal spheres for example, at least the surface of which having conductivity, are dispersed in the parts of the surface of the passivation film 5 which have an asperity shape. Furthermore, as is shown in FIG. 5 which is an exploded vertical cross sectional view along the line IV-IV in FIG. 3, an interval between surfaces of a pair of projection structured bodies adjacent in an oblique direction to the length direction of the metal electrode 2 is preferred to be about 80% of the diameter of each of the conductive beads 6. As a result of this, the diameter of each of the conductive beads 6 either matches or is slight larger than the interval of the surfaces of metal electrodes 4 within the pair of projection structured bodies described above. In addition, the height of the projection structured body is preferred to be lower than the diameter and higher than the radius of each of the conductive beads 6. By satisfying the dimension conditions described above, each of the dispersed conductive beads 6 are supported by the tip end of four projection structured bodies respectively.

Therefore, circuit boards are crimp bonded to the passivation film 5 in a state where electrodes of the circuit board 7 (flexible printed circuit board here) overlap above the metal electrode 4 and circuit boards 7 are aligned. In this way, the conductive beads 6 are pushed in between each of the four projection structured bodies respectively by the circuit board 7. From the size relationship described above, the conductive beads 6 which are pushed in this way conduct with the metal electrode 4 below the passivation film 5 after dislodging the comparatively flexible passivation film 6 and peeling or pushing through it.

In this way, even in a state whereby the conductive beads 6 pushed in the most to contact the surface of the passivation film 5, the peak juts out from the upper end of the projection structure body due to the dimension conditions described above. Therefore, the state where the conductive beads 6 conduct with an electrode formed above circuit board (flexible printed circuit board) is maintained. As a result, an electrode formed above circuit board 7 conducts with the metal electrode 2. In this way, according to the present embodiment, it is possible to conduct the metal electrode 2 with an electrode formed above circuit board 7 despite it being unnecessary to remove the passivation film 5 from above the metal electrode 4.

When the other electrode 7 is made to overlap the passivation film 5 and conductive beads 6, it is sufficient to insert an anisotropic conduction film there between. Here, an anisotropic conduction film is a sheet formed by mixing fine metal particles having conductivity into a thermosetting resin, and by heating in state where pressure is applied in the thickness direction, a property is produced whereby a current only flows in the thickness direction. Therefore, conductivity between each conductive beads 6 and an electrode formed above the circuit board 7 is higher than when no anisotropic conduction film is present.

Figure 6:
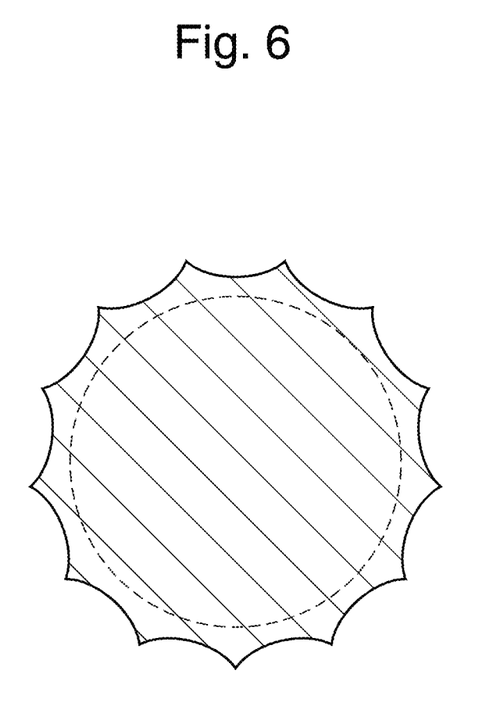
FIG. 6 is a cross sectional diagram showing a modified example of conductive beads.

In addition, a material formed with multiple pointed projections may be used as the conductive beads 6 across the entire surface as is shown in the cross sectional view in FIG. 6. Because it is possible for the pointed projections to break through the passivation film 6 when conductive beads 6 having this type of shape are used, conduction between the conductive beads 6 and the metal electrode 4 increases.

In addition, after the passivation film 5 is formed and before conductive beads 6 are dispersed, the passivation film 5 may be dry etched to pre-form the thickness of passivation film 5 thinner. If this is performed, conduction with the metal electrode 4 via the conductive beads 6 becomes easier.

Figure 7:
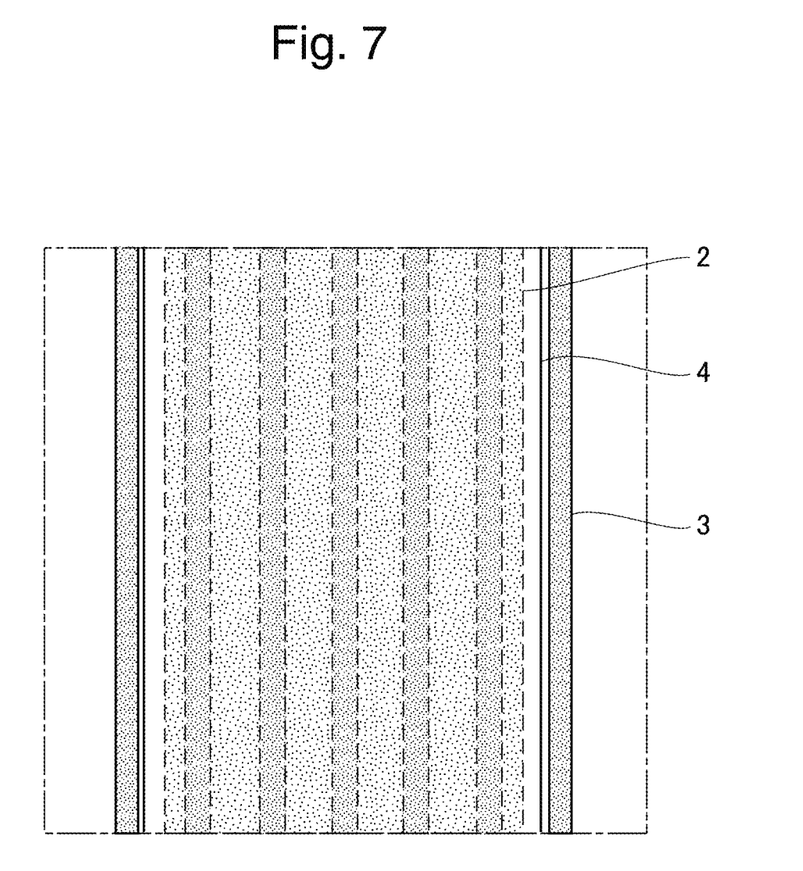
FIG. 7 is a planar diagram showing a modified example of a layout of an insulation film.

In addition, the insulation film 3 may have a stripe shape which extends in a direction parallel to the length direction of the metal electrode 2 as is shown in the exploded planner perspective view of FIG. 7. In the example shown in FIG. 7, seven insulation films 3 are formed and the five inner side insulation films 3 among the seven are formed above the surface of the metal electrode 2. The projection structured body is formed by forming the metal electrode 2 and passivation film 5 in order as in FIG. 2 above an exterior surface of each insulation film 3. An interval between surfaces of a pair of adjacent projection structured bodies is preferred to be around 80% of the diameter of each of the conductive beads 6. As a result, the diameter of each of the conductive beads 6 either matches or is slightly larger than the interval between surfaces of electrodes 4 within the pair of projection structured bodies described above. In addition, the height of the projection structured body is preferred to be lower than the diameter and higher than the radius of the projection structured body. As a result, each of the dispersed conductive beads 6 is supported between tip ends of two adjacent projection structured bodies. In addition, an electrode formed above the circuit board 7 and the metal electrode 2 conducts using a similar process to that described above.

Figure 8:
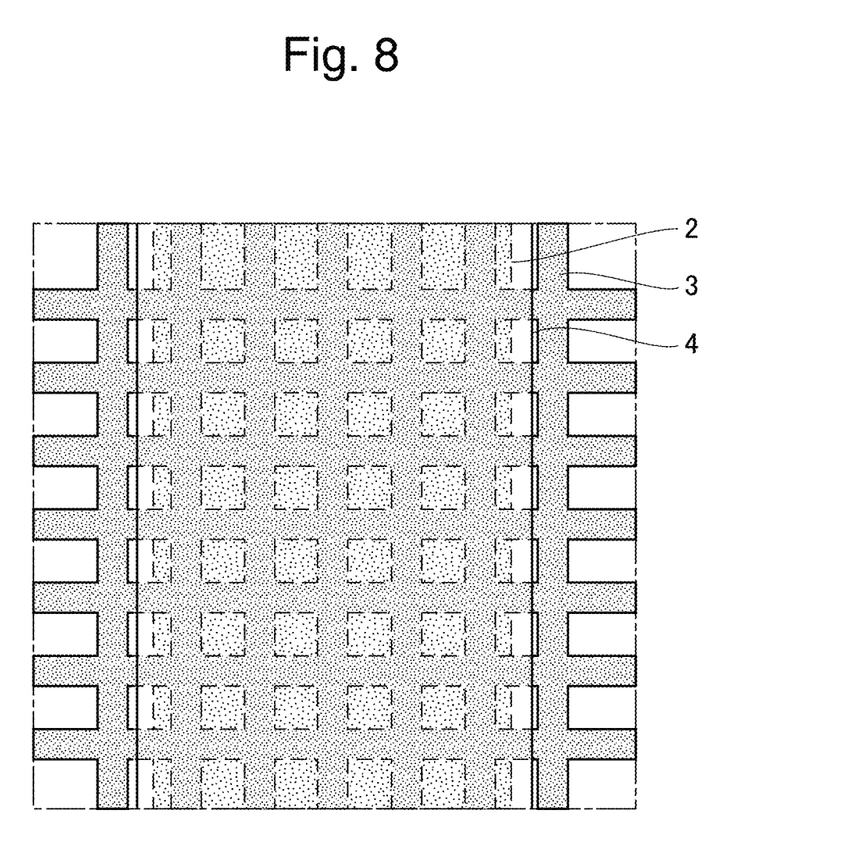
FIG. 8 is a planar diagram showing a modified example of a layout of an insulation film.

In addition, the insulation film 3 may have a stripe shape (lattice shape as a whole) each formed in a direction parallel and intersecting direction to the length direction of the metal electrode 2 as a lattice shape as is shown in the exploded planner perspective view of FIG. 8. In the example shown in FIG. 8, seven insulation films 31 are formed in the length direction of the metal electrode 2, seven insulation films 31 are formed in a direction intersecting the length direction of the metal electrode 2, and five inner side insulation films 31 among the seven formed in the latter direction are formed above the surface of the metal electrode 2. The projection structured body is formed by forming the metal electrode 4 and passivation film 5 in order as in FIG. 2 above the surface of each insulation film 3. It is preferred that the inner width of each lattice formed by the projection structured body is around 80% of the diameter of each of the conductive beads 6. As a result, the diameter of each of the conductive beads 6 either matches or is slightly larger than the inner width of each lattice formed by projection structured body described above. In addition, the height of the projection structured body is preferred to be lower than the diameter and higher than the radius of the projection structured body. As a result, each of the dispersed conductive beads 6 is supported by the edge of each lattice of a projection structured body. In addition, an electrode formed above the circuit board 7 and the metal electrode 2 conducts using a similar process to that described above.

Figure 10:
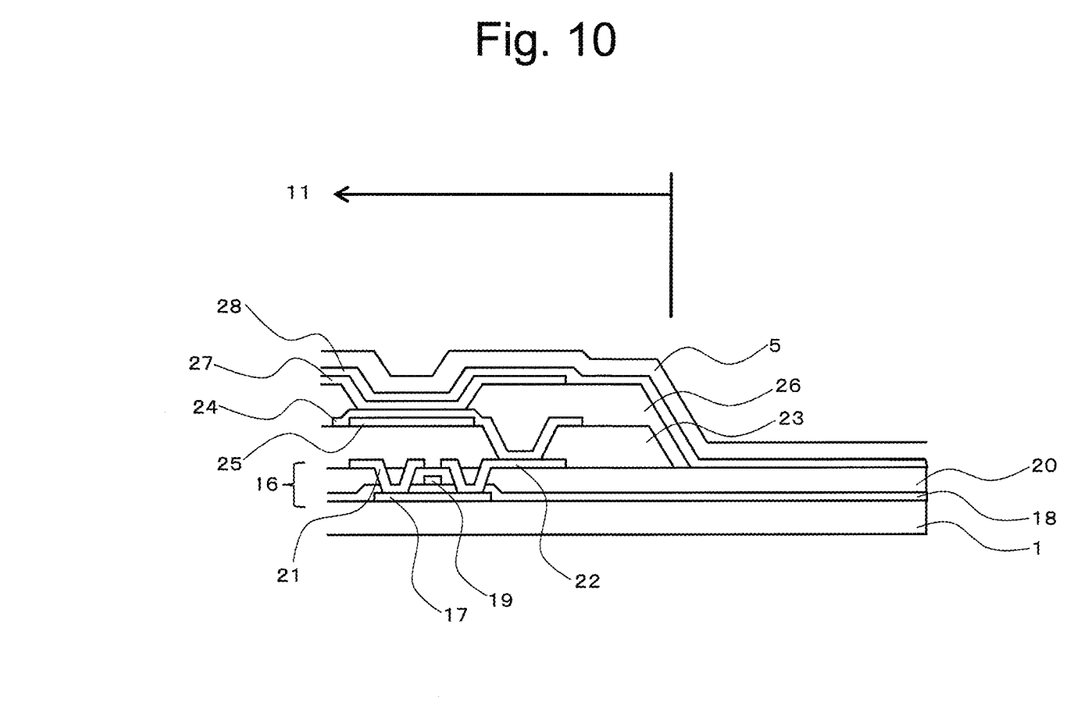
FIG. 10 is a pixel part cross sectional diagram of an organic EL display device.

FIG. 10 is a cross sectional diagram of a pixel part of the organic EL display device of the present invention. A circuit layer 16 is formed above a substrate 1 and a pixel layer if formed above the circuit layer 16. The circuit layer 16 has a gate insulation film 18 formed covering a semiconductor layer 17 and a gate electrode 19 which is a metal electrode is arranged above the gate insulation film 18. In addition, an interlayer insulation film 20 is arranged covering the gate electrode 19. A source electrode 21 and drain electrode 22 are connected to a semiconductor layer via a through hole formed in the gate insulation film 18 and the interlayer insulation film 20. The film covering the source electrode 21 and drain electrode 22 is a planarized film 23. By absorbing asperities on the upper surface of a circuit layer and planarizing the upper surface of the planarized film 23, it is easy to form a pixel electrode arranged on an upper layer of the planarized film 23. In the present embodiment, the pixel electrode is an anode 24. A metal reflective film 25 is formed on a lower layer of the anode 24 and the anode 24 and reflective film 25 can be collectively called a pixel electrode. The pixel electrode is connected with the drain electrode 22 of the circuit layer via a through hole formed in the planarized film 23.

The periphery including and end part of the pixel electrode is covered by an organic insulation film 26 which is called a bank. An organic layer 27 including a light emitting layer is formed on an upper surface of the bank 26 and a common electrode which becomes a cathode 28 is arranged on an upper layer of the organic layer 27. The organic layer 27 and anode 24 are in contact in an aperture part formed in the bank 26. That is, the anode 24, organic layer 27 and cathode 28 are formed in order from the bottom layer in the aperture part of the bank 26, and by supplying a current here, the organic layer emits light. The passivation film 25 is formed to cover the circuit layer and pixel layer on an upper layer of the anode electrode. The passivation film 5 extends as far as the terminal previously mentioned.

According to the present invention, it is possible to easily form a display device without the need to remove a passivation film even if the passivation film is formed on a terminal part.

According to the present invention, it is also possible to connect circuit board to a terminal using a simple operation without removing a passivation film from above a terminal.

What is claimed is:

1. An organic EL display device comprising:
a display area having an OLED element;
a terminal provided outside of the display area and electrically connected to a flexible printed circuit board; and
conductive beads provided between the terminal and the flexible printed circuit board;
wherein
the terminal comprises:
a first metal electrode formed above a substrate, a plurality of insulation films formed intermittently in a certain direction at an upper surface of the first metal electrode and overlapping the upper surface of the first metal electrode,
a second metal electrode formed so as to cover a part of the upper surface of the first metal electrode and at least a part of a surface of the plurality of the insulation films, wherein, the first metal electrode extends continuously from one of the plurality of insulation films that has an upper surface covered by the second metal electrode to an adjacent one of the plurality of insulation films that has an upper surface covered by the second metal electrode, and
a passivation film formed on at least a part of a surface of the second metal electrode;
the passivation film has a plurality of projection structures, wherein at least two adjacent projection structures of the plurality of projection structures have wall surfaces facing each other and at least a first part of the second metal electrode is provided along a portion of a wall surface laterally opposite to one of the wall surfaces of the at least two adjacent projection structures and a second part of the second metal electrode is provided along a portion of a wall surface laterally opposite to the other one of the wall surfaces of the at least two adjacent projection structures; and the conductive beads are sandwiched between the two adjacent projection structures, and electrically connected to the second metal electrode, wherein a first side surface of the conductive beads and a second side surface of the conductive beads respectively contact with the first part of the second metal electrode and the second part of the second metal electrode.

2. The organic EL display device according to claim 1, wherein a film thickness of the passivation film on a side surface of at least one of the plurality of insulation films is thinner than a film thickness at an upper surface of the at least one of the plurality of insulation films.

3. The organic EL display device according to claim 1, wherein an interval of the at least two adjacent projection structures is narrower than a diameter of the conductive beads.

4. The organic EL display device according to claim 1, wherein a height of one of the at least two adjacent projection structure of the plurality of projection structures is lower than a diameter of the conductive beads and higher than a radius of the conductive beads.

5. The organic EL display device according to claim 1, wherein the conductive beads conduct with the second metal electrode.

6. The organic EL display device according to claim 1, wherein a plurality of pointed projections are formed on a surface of the conductive beads.

7. The organic EL display device according to claim 1, wherein the plurality of insulation films are arranged in a plurality of pillar shapes and intersecting two directions at a uniform pitch.

8. The organic EL display device according to claim 1, wherein the plurality of insulation films are arranged in a plurality of stripe shapes.

9. The organic EL display device according to claim 1, wherein the plurality of insulation films are arranged in a plurality of lattice shapes.

10. The organic EL display device according to claim 1, wherein the display area displays an image based on a signal input to the terminal from the circuit board and the passivation film covers the display area.

\* \* \* \* \*